United States Patent
Osamura et al.

(10) Patent No.: US 8,381,997 B2
(45) Date of Patent: Feb. 26, 2013

(54) RADIO FREQUENCY IC DEVICE AND METHOD OF MANUFACTURING THE SAME

(75) Inventors: Makoto Osamura, Nagaokakyo (JP); Kenji Kubota, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/308,575

(22) Filed: Dec. 1, 2011

(65) Prior Publication Data

US 2012/0074229 A1    Mar. 29, 2012

Related U.S. Application Data

(63) Continuation of application No. PCT/JP2010/056812, filed on Apr. 16, 2010.

(30) Foreign Application Priority Data

Jun. 3, 2009   (JP) ................................ 2009-134117

(51) Int. Cl.
*G06K 19/067* (2006.01)
(52) U.S. Cl. .................................... 235/492; 340/572.8
(58) Field of Classification Search ................. 235/492; 340/572.7–572.8
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |

(Continued)

FOREIGN PATENT DOCUMENTS

| | | |
|---|---|---|
| CA | 2 279 176 A1 | 7/1998 |
| DE | 10 2006 057 369 A1 | 6/2008 |

(Continued)

OTHER PUBLICATIONS

Official Communication issued in International Application No. PCT/JP2007/066007, mailed on Nov. 27, 2007.

(Continued)

*Primary Examiner* — Thien M Le
*Assistant Examiner* — Christle Marshall
(74) *Attorney, Agent, or Firm* — Keating & Bennett, LLP

(57) ABSTRACT

A radio frequency IC device that prevents variations in the value of capacitive coupling between a radio frequency IC element and a radiation electrode and has good signal transmission efficiency includes a radio frequency IC element including input/output electrodes and, a first base including intermediate electrodes that are capacitively coupled to the input/output electrodes and have capacitance values C1$a$ and C1$b$, respectively, and a second base including radiation electrodes and that are capacitively coupled to the intermediate electrodes and have capacitance values C2$a$ and C2$b$, respectively. A capacitance C1 obtained by combining C1$a$ and C1$b$ is smaller than a capacitance C2 obtained by combining C2$a$ and C2$b$.

9 Claims, 11 Drawing Sheets

U.S. PATENT DOCUMENTS

| | | | |
|---|---|---|---|
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,452,563 B1 | 9/2002 | Porte | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,861,731 B2 | 3/2005 | Buijsman et al. | |
| 6,927,738 B2 | 8/2005 | Senba et al. | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0067316 A1 | 6/2002 | Yokoshima et al. | |
| 2002/0093457 A1 | 7/2002 | Hamada et al. | |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0169153 A1 | 9/2003 | Muller | |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0032926 A1 | 2/2006 | Baba et al. | |
| 2006/0044192 A1 | 3/2006 | Egbert | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0214801 A1 | 9/2006 | Murofushi et al. | |
| 2006/0220871 A1 | 10/2006 | Baba et al. | |
| 2006/0244676 A1 | 11/2006 | Uesaka | |
| 2006/0267138 A1 | 11/2006 | Kobayashi | |
| 2006/0289917 A1* | 12/2006 | Fujiwara et al. ............... 257/296 |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0229276 A1 | 10/2007 | Yamagajo et al. | |
| 2007/0247387 A1 | 10/2007 | Kubo et al. | |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0087990 A1 | 4/2008 | Kato et al. | |
| 2008/0143630 A1 | 6/2008 | Kato et al. | |
| 2008/0169905 A1 | 7/2008 | Slatter | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0021352 A1 | 1/2009 | Kataya et al. | |
| 2009/0021446 A1 | 1/2009 | Kataya et al. | |
| 2009/0065594 A1 | 3/2009 | Kato et al. | |
| 2009/0109102 A1 | 4/2009 | Dokai et al. | |
| 2009/0146821 A1* | 6/2009 | Kato et al. ............... 340/572.7 |
| 2009/0160719 A1 | 6/2009 | Kato et al. | |
| 2009/0201116 A1 | 8/2009 | Orihara | |
| 2009/0224061 A1 | 9/2009 | Kato et al. | |
| 2009/0231106 A1 | 9/2009 | Okamura | |
| 2009/0262041 A1 | 10/2009 | Ikemoto et al. | |
| 2009/0278687 A1 | 11/2009 | Kato | |
| 2009/0321527 A1 | 12/2009 | Kato et al. | |
| 2010/0103058 A1 | 4/2010 | Kato et al. | |
| 2011/0031320 A1 | 2/2011 | Kato et al. | |
| 2011/0063184 A1 | 3/2011 | Furumura et al. | |
| 2011/0199713 A1* | 8/2011 | Kato et al. ............... 361/212 |
| 2012/0056001 A1* | 3/2012 | Dokai et al. ............... 235/492 |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 988 491 A1 | 11/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 02-164105 A | 6/1990 |
| JP | 02-256208 A | 10/1990 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |

| | | | | | | |
|---|---|---|---|---|---|---|
| JP | 04-134807 U | 12/1992 | | JP | 2001-028036 A | 1/2001 |
| JP | 05-327331 A | 12/1993 | | JP | 2007-18067 A | 1/2001 |
| JP | 6-53733 A | 2/1994 | | JP | 2001-043340 A | 2/2001 |
| JP | 06-077729 A | 3/1994 | | JP | 2001-66990 A | 3/2001 |
| JP | 06-177635 A | 6/1994 | | JP | 2001-76111 A | 3/2001 |
| JP | 6-260949 A | 9/1994 | | JP | 2001-101369 A | 4/2001 |
| JP | 07-183836 A | 7/1995 | | JP | 2001-505682 A | 4/2001 |
| JP | 08-055725 A | 2/1996 | | JP | 2001-168628 A | 6/2001 |
| JP | 08-056113 A | 2/1996 | | JP | 2001-188890 A | 7/2001 |
| JP | 8-87580 A | 4/1996 | | JP | 2001-240046 A | 9/2001 |
| JP | 08-88586 A | 4/1996 | | JP | 2001-256457 A | 9/2001 |
| JP | 08-088586 A | 4/1996 | | JP | 2001-257292 A | 9/2001 |
| JP | 11-149537 A | 6/1996 | | JP | 2001-514777 A | 9/2001 |
| JP | 08-176421 A | 7/1996 | | JP | 2001-319380 A | 11/2001 |
| JP | 08-180160 A | 7/1996 | | JP | 2001-331976 A | 11/2001 |
| JP | 08-279027 A | 10/1996 | | JP | 2001-332923 A | 11/2001 |
| JP | 08-307126 A | 11/1996 | | JP | 2001-339226 A | 12/2001 |
| JP | 08-330372 A | 12/1996 | | JP | 2001-344574 A | 12/2001 |
| JP | 09-014150 A | 1/1997 | | JP | 2001-351083 A | 12/2001 |
| JP | 09-035025 A | 2/1997 | | JP | 2001-351084 A | 12/2001 |
| JP | 09-093029 A | 4/1997 | | JP | 2001-352176 A | 12/2001 |
| JP | 9-93029 A | 4/1997 | | JP | 2002-024776 A | 1/2002 |
| JP | 09-245381 A | 9/1997 | | JP | 2002-026513 A | 1/2002 |
| JP | 09-252217 A | 9/1997 | | JP | 2002-32731 A | 1/2002 |
| JP | 09-270623 A | 10/1997 | | JP | 2002-042076 A | 2/2002 |
| JP | 09-284038 A | 10/1997 | | JP | 2002-063557 A | 2/2002 |
| JP | 9-512367 A | 12/1997 | | JP | 2002-505645 A | 2/2002 |
| JP | 10-069533 A | 3/1998 | | JP | 2002-076750 A | 3/2002 |
| JP | 10-69533 A | 3/1998 | | JP | 2002-76750 A | 3/2002 |
| JP | 10-505466 A | 5/1998 | | JP | 2002-111363 A | 4/2002 |
| JP | 10-171954 A | 6/1998 | | JP | 2002-150245 A | 5/2002 |
| JP | 10-173427 A | 6/1998 | | JP | 2002-157564 A | 5/2002 |
| JP | 10-193849 A | 7/1998 | | JP | 2002-158529 A | 5/2002 |
| JP | 10-193851 A | 7/1998 | | JP | 2002-175508 A | 6/2002 |
| JP | 10-293828 A | 11/1998 | | JP | 2002-183690 A | 6/2002 |
| JP | 11-025244 A | 1/1999 | | JP | 2002-185358 A | 6/2002 |
| JP | 11-039441 A | 2/1999 | | JP | 2002-204117 A | 7/2002 |
| JP | 11-075329 A | 3/1999 | | JP | 2002-522849 A | 7/2002 |
| JP | 11-085937 A | 3/1999 | | JP | 2002-230128 A | 8/2002 |
| JP | 11-88241 A | 3/1999 | | JP | 2002-232221 A | 8/2002 |
| JP | 11-102424 A | 4/1999 | | JP | 2002-252117 A | 9/2002 |
| JP | 11-103209 A | 4/1999 | | JP | 2002-259934 A | 9/2002 |
| JP | 11-149536 A | 6/1999 | | JP | 2002-280821 A | 9/2002 |
| JP | 11-149538 A | 6/1999 | | JP | 2002-298109 A | 10/2002 |
| JP | 11-219420 A | 8/1999 | | JP | 2002-308437 A | 10/2002 |
| JP | 11-220319 A | 8/1999 | | JP | 2002-319008 A | 10/2002 |
| JP | 11-282993 A | 10/1999 | | JP | 2002-319009 A | 10/2002 |
| JP | 11-328352 A | 11/1999 | | JP | 2002-319812 A | 10/2002 |
| JP | 11-331014 A | 11/1999 | | JP | 2002-362613 A | 12/2002 |
| JP | 11-346114 A | 12/1999 | | JP | 2002-366917 A | 12/2002 |
| JP | 11-515094 A | 12/1999 | | JP | 2002-373029 A | 12/2002 |
| JP | 2000-21128 A | 1/2000 | | JP | 2002-373323 A | 12/2002 |
| JP | 2000-021639 A | 1/2000 | | JP | 2002-374139 A | 12/2002 |
| JP | 2000-022421 A | 1/2000 | | JP | 2003-006599 A | 1/2003 |
| JP | 2005-229474 A | 1/2000 | | JP | 2003-016412 A | 1/2003 |
| JP | 2000-059260 A | 2/2000 | | JP | 2003-022912 A | 1/2003 |
| JP | 2000-085283 A | 3/2000 | | JP | 2003-026177 A | 1/2003 |
| JP | 2000-090207 A | 3/2000 | | JP | 2003-030612 A | 1/2003 |
| JP | 2000-132643 A | 5/2000 | | JP | 2003-44789 A | 2/2003 |
| JP | 2000-137778 A | 5/2000 | | JP | 2003-046318 A | 2/2003 |
| JP | 2000-137779 A | 5/2000 | | JP | 2003-58840 A | 2/2003 |
| JP | 2000-137785 A | 5/2000 | | JP | 2003-87044 A | 2/2003 |
| JP | 2000-148948 A | 5/2000 | | JP | 2003-067711 A | 3/2003 |
| JP | 2000-172812 A | 6/2000 | | JP | 2003-069335 A | 3/2003 |
| JP | 2000-209013 A | 7/2000 | | JP | 2003-076947 A | 3/2003 |
| JP | 2000-222540 A | 8/2000 | | JP | 2003-76963 A | 3/2003 |
| JP | 2000-510271 A | 8/2000 | | JP | 2003-78333 A | 3/2003 |
| JP | 2000-242754 A | 9/2000 | | JP | 2003-078336 A | 3/2003 |
| JP | 2000-243797 A | 9/2000 | | JP | 2003-085501 A | 3/2003 |
| JP | 2000-251049 A | 9/2000 | | JP | 2003-085520 A | 3/2003 |
| JP | 2000-261230 A | 9/2000 | | JP | 2003-87008 A | 3/2003 |
| JP | 2000-276569 A | 10/2000 | | JP | 2003-099720 A | 4/2003 |
| JP | 2000-286634 A | 10/2000 | | JP | 2003-099721 A | 4/2003 |
| JP | 2000-286760 A | 10/2000 | | JP | 2003-110344 A | 4/2003 |
| JP | 2000-311226 A | 11/2000 | | JP | 2003-132330 A | 5/2003 |
| JP | 2000-321984 A | 11/2000 | | JP | 2003-134007 A | 5/2003 |
| JP | 3075400 U | 11/2000 | | JP | 2003-155062 A | 5/2003 |
| JP | 2000-349680 A | 12/2000 | | JP | 2003-158414 A | 5/2003 |
| JP | 2001-10264 A | 1/2001 | | JP | 2003-168760 A | 6/2003 |

| | | | | | | |
|---|---|---|---|---|---|---|
| JP | 2003-179565 A | 6/2003 | | JP | 2005-346820 A | 12/2005 |
| JP | 2003-187207 A | 7/2003 | | JP | 2005-352858 A | 12/2005 |
| JP | 2003-187211 A | 7/2003 | | JP | 2006-13976 A | 1/2006 |
| JP | 2003-188338 A | 7/2003 | | JP | 2006-013976 A | 1/2006 |
| JP | 2003-188620 A | 7/2003 | | JP | 2006-025390 A | 1/2006 |
| JP | 2003-198230 A | 7/2003 | | JP | 2006-031766 A | 2/2006 |
| JP | 2003-209421 A | 7/2003 | | JP | 2006-033312 A | 2/2006 |
| JP | 2003-216919 A | 7/2003 | | JP | 2006-39902 A | 2/2006 |
| JP | 2003-218624 A | 7/2003 | | JP | 2006-039947 A | 2/2006 |
| JP | 2003-233780 A | 8/2003 | | JP | 2006-42059 A | 2/2006 |
| JP | 2003-242471 A | 8/2003 | | JP | 2006-42097 A | 2/2006 |
| JP | 2003-243918 A | 8/2003 | | JP | 2006-053833 A | 2/2006 |
| JP | 2003-249813 A | 9/2003 | | JP | 2006-67479 A | 3/2006 |
| JP | 2003-529163 A | 9/2003 | | JP | 2006-72706 A | 3/2006 |
| JP | 2003-288560 A | 10/2003 | | JP | 2006-80367 A | 3/2006 |
| JP | 2003-309418 A | 10/2003 | | JP | 2006-92630 A | 4/2006 |
| JP | 2003-317060 A | 11/2003 | | JP | 2006-102953 A | 4/2006 |
| JP | 2003-331246 A | 11/2003 | | JP | 2006-107296 A | 4/2006 |
| JP | 2003-332820 A | 11/2003 | | JP | 2006-513594 A | 4/2006 |
| JP | 2003-536302 A | 12/2003 | | JP | 2006-148462 A | 6/2006 |
| JP | 2004-040597 A | 2/2004 | | JP | 2006-148518 A | 6/2006 |
| JP | 2004-505481 A | 2/2004 | | JP | 2006-151402 A | 6/2006 |
| JP | 2004-082775 A | 3/2004 | | JP | 2006-174151 A | 6/2006 |
| JP | 2004-88218 A | 3/2004 | | JP | 2006-195795 A | 7/2006 |
| JP | 2004-93693 A | 3/2004 | | JP | 2006-203187 A | 8/2006 |
| JP | 2004-096566 A | 3/2004 | | JP | 2006-203852 A | 8/2006 |
| JP | 2004-127230 A | 4/2004 | | JP | 2006-217000 A | 8/2006 |
| JP | 2004-140513 A | 5/2004 | | JP | 2006-232292 A | 9/2006 |
| JP | 2004-213582 A | 7/2004 | | JP | 2006-237674 A | 9/2006 |
| JP | 2004-519916 A | 7/2004 | | JP | 2006-270212 A | 10/2006 |
| JP | 2004-234595 A | 8/2004 | | JP | 2006-270681 A | 10/2006 |
| JP | 2004-253858 A | 9/2004 | | JP | 2006-270766 A | 10/2006 |
| JP | 2004-527864 A | 9/2004 | | JP | 2006-285911 A | 10/2006 |
| JP | 2004-280390 A | 10/2004 | | JP | 2006-295879 A | 10/2006 |
| JP | 2004-282403 A | 10/2004 | | JP | 2006-302219 A | 11/2006 |
| JP | 2004-287767 A | 10/2004 | | JP | 2006-309401 A | 11/2006 |
| JP | 2004-297249 A | 10/2004 | | JP | 2006-311239 A | 11/2006 |
| JP | 2004-297681 A | 10/2004 | | JP | 2006-323481 A | 11/2006 |
| JP | 2004-304370 A | 10/2004 | | JP | 2006-339964 A | 12/2006 |
| JP | 2004-319848 A | 11/2004 | | JP | 2007-007888 A | 1/2007 |
| JP | 2004-326380 A | 11/2004 | | JP | 2007-13120 A | 1/2007 |
| JP | 2004-334268 A | 11/2004 | | JP | 2007-28002 A | 2/2007 |
| JP | 2004-336250 A | 11/2004 | | JP | 2007-043535 A | 2/2007 |
| JP | 2004-343000 A | 12/2004 | | JP | 2007-048126 A | 2/2007 |
| JP | 2004-362190 A | 12/2004 | | JP | 2007-65822 A | 3/2007 |
| JP | 2004-362341 A | 12/2004 | | JP | 2007-79687 A | 3/2007 |
| JP | 2004-362602 A | 12/2004 | | JP | 2007-81712 A | 3/2007 |
| JP | 2005-5866 A | 1/2005 | | JP | 2007-096768 A | 4/2007 |
| JP | 2005-18156 A | 1/2005 | | JP | 2007-102348 A | 4/2007 |
| JP | 2005-033461 A | 2/2005 | | JP | 2007-116347 A | 5/2007 |
| JP | 2005-124061 A | 5/2005 | | JP | 2007-122542 A | 5/2007 |
| JP | 2005-128592 A | 5/2005 | | JP | 2007-150642 A | 6/2007 |
| JP | 2005-129019 A | 5/2005 | | JP | 2007-150868 A | 6/2007 |
| JP | 2005-135132 A | 5/2005 | | JP | 2007-159083 A | 6/2007 |
| JP | 2005-136528 A | 5/2005 | | JP | 2007-159129 A | 6/2007 |
| JP | 2005-137032 A | 5/2005 | | JP | 2007-166133 A | 6/2007 |
| JP | 3653099 B2 | 5/2005 | | JP | 2007-172369 A | 7/2007 |
| JP | 2005-165839 A | 6/2005 | | JP | 2007-172527 A | 7/2007 |
| JP | 2005-167327 A | 6/2005 | | JP | 2007-228325 A | 9/2007 |
| JP | 2005-167813 A | 6/2005 | | JP | 2007-266999 A | 10/2007 |
| JP | 2005-190417 A | 7/2005 | | JP | 2007-272264 A | 10/2007 |
| JP | 2005-191705 A | 7/2005 | | JP | 2007-287128 A | 11/2007 |
| JP | 2005-192124 A | 7/2005 | | JP | 2007-295557 A | 11/2007 |
| JP | 2005-210676 A | 8/2005 | | JP | 2007-312350 A | 11/2007 |
| JP | 2005-210680 A | 8/2005 | | JP | 2007-324865 A | 12/2007 |
| JP | 2005-217822 A | 8/2005 | | JP | 2008-033716 A | 2/2008 |
| JP | 2005-236339 A | 9/2005 | | JP | 2008-72243 A | 3/2008 |
| JP | 2005-244778 A | 9/2005 | | JP | 2008-083867 A | 4/2008 |
| JP | 2005-252853 A | 9/2005 | | JP | 2008-097426 A | 4/2008 |
| JP | 2005-275870 A | 10/2005 | | JP | 4069958 B2 | 4/2008 |
| JP | 2005-284352 A | 10/2005 | | JP | 2008-107947 A | 5/2008 |
| JP | 2005-293537 A | 10/2005 | | JP | 2008-148345 A | 6/2008 |
| JP | 2005-295135 A | 10/2005 | | JP | 2008-519347 A | 6/2008 |
| JP | 2005-311205 A | 11/2005 | | JP | 2008-160874 A | 7/2008 |
| JP | 2005-321305 A | 11/2005 | | JP | 2008-197714 A | 8/2008 |
| JP | 2005-322119 A | 11/2005 | | JP | 2008-288915 A | 11/2008 |
| JP | 2005-335755 A | 12/2005 | | JP | 11-175678 A | 1/2009 |
| JP | 2005-340759 A | 12/2005 | | JP | 2009-017284 A | 1/2009 |
| JP | 2005-345802 A | 12/2005 | | JP | 2009-25870 A | 2/2009 |

| | | | |
|---|---|---|---|
| JP | 2009-27291 A | 2/2009 | |
| JP | 2009-044715 A | 2/2009 | |
| JP | 3148168 U | 2/2009 | |
| JP | 2009-182630 A | 8/2009 | |
| JP | 2010-009196 A | 1/2010 | |
| JP | 4609604 B2 | 1/2011 | |
| NL | 9100176 A | 3/1992 | |
| NL | 9100347 A | 3/1992 | |
| WO | 98/33142 A1 | 7/1998 | |
| WO | 99/67754 A1 | 12/1999 | |
| WO | 00/10122 A2 | 2/2000 | |
| WO | 01/95242 A2 | 12/2001 | |
| WO | 02/48980 A1 | 6/2002 | |
| WO | 02/061675 A1 | 8/2002 | |
| WO | 02/097723 A1 | 12/2002 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A | 8/2005 | |
| WO | 2005/091434 A1 | 9/2005 | |
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/097385 A1 | 8/2007 | |
| WO | 2007/102360 A1 | 9/2007 | |
| WO | 2007/105348 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/133018 A1 | 11/2008 | |
| WO | 2008/140037 A1 | 11/2008 | |
| WO | 2008/142957 A1 | 11/2008 | |
| WO | 2009/011144 A1 | 1/2009 | |
| WO | 2009/011376 A1 | 1/2009 | |
| WO | 2009/011423 A1 | 1/2009 | |
| WO | 2009/081719 A1 | 7/2009 | |
| WO | 2009/110381 A1 | 9/2009 | |

OTHER PUBLICATIONS

Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed on Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device", U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895; filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.

Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.: "Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695; filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626; filed Apr. 11, 2011.
Official Communication issued in International Patent Application No. PCT/JP2009/070617, mailed on Mar. 16, 2010.
Nagai, "Mounting Technique of RFID by Roll-to-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.

Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709; filed Jul. 2, 2009.
Official communication issued in counterpart International Application No. PCT/JP2008/062947, mailed Aug. 19, 2008.
Official communication issued in counterpart International Application No. PCT/JP2008/055567, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.

Official Communication issued in corresponding Japanese Patent Application No. 2011-032311, mailed on Aug. 2, 2011.

Official Communication issued in corresponding Japanese Patent Application No. 2011-032312, mailed on Aug. 2, 2011.

Official Communication issued in corresponding Japanese Patent Application No. 2011-032311, mailed on Aug. 23, 2011.

Kato et al.: "Wireless IC Device Component and Wireless IC Device"; U.S. Appl. No. 13/241,823, filed Sep. 23, 2011.

Kato et al.: "Antenna Device and Method of Setting Resonant Frequency of Antenna Device"; U.S. Appl. No. 13/272,365, filed on Oct. 13, 2011.

Official Communication issued in International Patent Application No. PCT/JP2010/056812, mailed on Jul. 13, 2010.

Dokai et al.: "Optical Disc"; U.S. Appl. No. 13/295,153, filed Nov. 14, 2011.

* cited by examiner

RADIO FREQUENCY IC DEVICE AND METHOD OF MANUFACTURING THE SAME

BACKGROUND OF THE INVENTION

1. Field of the Invention

The present invention relates to radio frequency IC devices and methods of manufacturing the same, and, more particularly, to a radio frequency IC device preferably for use in an RFID (Radio Frequency Identification) system and a method of manufacturing the radio frequency IC device.

2. Description of the Related Art

In recent years, as a product management system, an RFID system has been developed in which a reader/writer for generating an induction field communicates with an IC tag (hereinafter referred to as a radio frequency IC device) attached to a product in a non-contact manner so as to obtain predetermined information stored in the IC tag. For example, Japanese Unexamined Patent Application Publication No. 2008-160874 discloses a radio frequency IC device used in an RFID system.

In a radio frequency IC device disclosed in Japanese Unexamined Patent Application Publication No. 2008-160874 (for example, see FIG. 5 in Japanese Unexamined Patent Application Publication No. 2008-160874), a flexible sheet including a feeding circuit provided thereon and a radio frequency IC chip mounted on the feeding circuit and another flexible sheet on which a radiation plate is disposed are bonded so that the feeding circuit and the radiation plate are capacitively coupled.

However, in this radio frequency IC device, high accuracy is required when bonding these flexible sheets. The accuracy is low, variations in the value of capacitive coupling between the radio frequency IC chip and the radiation plate occur and an impedance deviates from a set value. As a result, signal emission/reception performed by the radiation plate becomes unstable and signal transmission efficiency is reduced.

SUMMARY OF THE INVENTION

Preferred embodiments of the present invention provide a radio frequency IC device that prevents variations in the value of capacitive coupling between a radio frequency IC element and a radiation electrode and has good signal transmission efficiency, and also provide a method of manufacturing the radio frequency IC device.

A radio frequency IC device according to a first preferred embodiment of the present invention includes a radio frequency IC element including an input/output electrode, a first base including an intermediate electrode capacitively coupled to the input/output electrode with a capacitance value $C1$, and a second base including a radiation electrode capacitively coupled to the intermediate electrode with a capacitance value $C2$ that is greater than $C1$.

A radio frequency IC device manufacturing method according to a second preferred embodiment of the present invention includes a step of mounting a radio frequency IC element including an input/output electrode on a first base including an intermediate electrode and capacitively coupling the input/output electrode and the intermediate electrode with a capacitance value $C$ and a step of mounting the first base on which the radio frequency IC element is mounted on a second base including a radiation electrode and capacitively coupling the intermediate electrode and the radiation electrode with a capacitance value $C2$ that is greater than $C1$.

In the radio frequency IC device, the radio frequency IC element and the radiation electrode are coupled via a capacitor having the capacitance value $C1$ and a capacitor having the capacitance value $C2$ which are connected in series between the radio frequency IC element and the radiation electrode. That is, $C1$ and $C2$ are connected in series on a transmission path of a radio frequency signal. Here, the relationship between $C1$ and $C2$ is $C1<C2$. In this case, the total capacitance value $C$ between the radio frequency IC element and the radiation electrode is controlled by the capacitance value $C1$ that is the smaller one. The capacitance value $C1$ is obtained between the input/output electrode included in the radio frequency IC element and the intermediate electrode included in the first base. The radio frequency IC element can be accurately mounted on the first base using an IC installation apparatus in the related art, and variations in the capacitance value $C1$ rarely occur. On the other hand, the capacitance value $C2$ is obtained between the intermediate electrode and the radiation electrode. Even if the first base is inaccurately mounted on the second base and variations in the capacitance value $C2$ occur, the capacitance value $C2$ has little effect on the capacitance value $C$ between the radio frequency IC element and the radiation electrode. Accordingly, the occurrence of variations in the capacitance value $C$ between the radio frequency IC element and the radiation electrode is suppressed and minimized, and the reduction in signal transmission efficiency can be prevented.

According to preferred embodiments of the present invention, variations in the value of capacitive coupling between a radio frequency IC element and a radiation electrode can be prevented, signal emission/reception performed by the radiation electrode becomes stable, and signal transmission efficiency is not reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A-1C illustrate a radio frequency IC device according to a first preferred embodiment of the present invention, wherein FIG. 1A is a cross-sectional view of the radio frequency IC device, FIG. 1B is a plan view of the radio frequency IC device, and FIG. 1C is an equivalent circuit diagram of the radio frequency IC device.

FIGS. 7A-7C illustrate a radio frequency IC device according to a second preferred embodiment of the present invention, wherein FIG. 7A is a cross-sectional view of the radio frequency IC device, FIG. 7B is an equivalent circuit diagram of the radio frequency IC device, and FIG. 7C is a plan view of the radio frequency IC device.

FIGS. 8A and 8B illustrate a radio frequency IC device according to a third preferred embodiment of the present invention, wherein FIG. 8A is a cross-sectional view of the radio frequency IC device and FIG. 8B is an equivalent circuit diagram of the radio frequency IC device.

FIGS. 12A and 12B illustrate a radio frequency IC device according to a seventh preferred embodiment of the present invention, wherein FIG. 12A is a cross-sectional view of the radio frequency IC device and FIG. 12B describes a process of manufacturing the radio frequency IC device.

DETAILED DESCRIPTION OF THE PREFERRED EMBODIMENTS

Figure 1A:
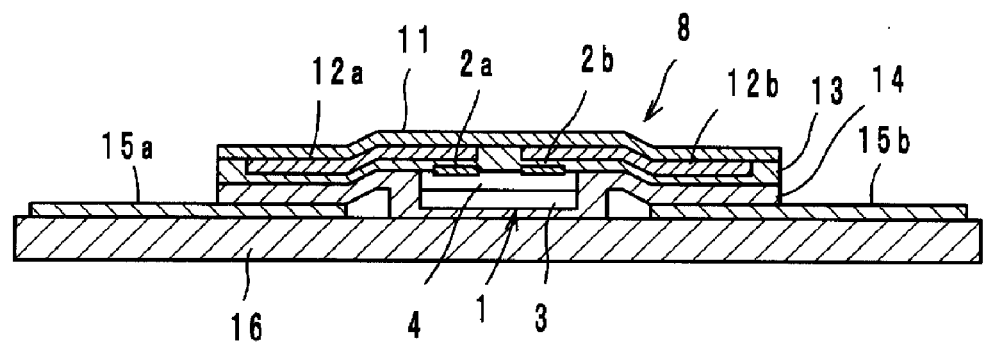

A radio frequency IC device according to various preferred embodiments of the present invention and a method of manufacturing the radio frequency IC device will be described below with reference to the accompanying drawings. In the drawings, the same reference numeral is used to represent the same component or the same element so as to avoid repeated explanation.

First Preferred Embodiment

Figure 1B:
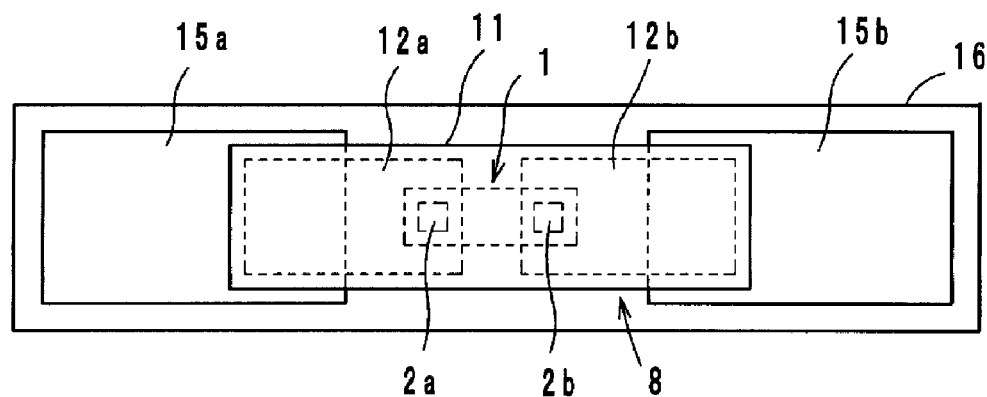

As illustrated in FIGS. 1A and 1B, a radio frequency IC device according to the first preferred embodiment includes a radio frequency IC element 1 obtained by mounting a radio frequency IC chip 5 (see FIG. 4) on a feeding circuit board 4 and covering the radio frequency IC chip 5 with a resin layer 3, a first base 11 including intermediate electrodes 12a and 12b, and a second base 16 including radiation electrodes 15a and 15b.

Figure 4:
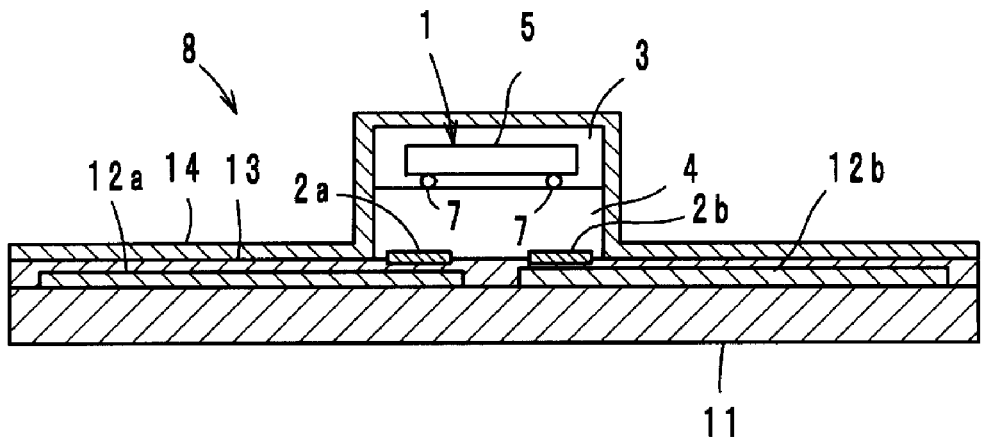
FIG. 4 is a cross-sectional view of a basic module included in a radio frequency IC device according to the first preferred embodiment of the present invention.

As illustrated in FIG. 4, the radio frequency IC chip 5 is connected to a feeding circuit (not illustrated) in the feeding circuit board 4 via solder bumps 7, and input/output electrodes 2a and 2b are disposed on the surface of the feeding circuit board 4. The radio frequency IC element 1 is attached to the first base 11 via an insulating adhesive layer 13 so that the input/output electrodes 2a and 2b face the intermediate electrodes 12a and 12b, respectively. The input/output electrodes 2a and 2b are capacitively coupled to the intermediate electrodes 12a and 12b with capacitance values C1a and C1b, respectively. Thus, the unit in which the radio frequency IC element 1 and the first base 11 are integrated is called a basic module 8.

The first base 11 is attached to the second base 16 via an insulating adhesive layer 14 so that the intermediate electrodes 12a and 12b face the radiation electrodes 15a and 15b, respectively. The intermediate electrodes 12a and 12b are capacitively coupled to the radiation electrodes 15a and 15b with capacitance values C2a and C2b, respectively.

The first base 11 and the second base 16 are preferably made of an insulating material (dielectric) such as a PET film or paper, for example. Various electrodes are preferably formed of an evaporated metal film such as an Au or Ag film, an applied film, or a thin metal film such as aluminum foil, for example. The insulating adhesive layers 13 and 14 are preferably formed of, for example, an epoxy resin. The radio frequency IC chip 5 includes a clock circuit, a logic circuit, and a memory circuit, stores necessary information as is known, and can transmit/receive a predetermined high-frequency signal.

In a radio frequency IC device having the above-described configuration, the radiation electrodes 15a and 15b receive a high-frequency signal (for example, in the UHF or HF frequency band) emitted from a reader/writer (not illustrated), a feeding circuit (not illustrated) in the feeding circuit board 4 that is capacitively coupled to the radiation electrodes 15a and 15b resonates, and energy obtained by the resonance is supplied to the radio frequency IC chip 5. On the other hand, predetermined energy is extracted from the received signal, the feeding circuit makes information stored in the radio frequency IC chip 5 conform to a predetermined frequency using the energy, and a transmission signal is transmitted to the radiation electrodes 15a and 15b via the above-described capacitive coupling and is transmitted to the reader/writer from the radiation electrodes 15a and 15b.

Figure 1C:
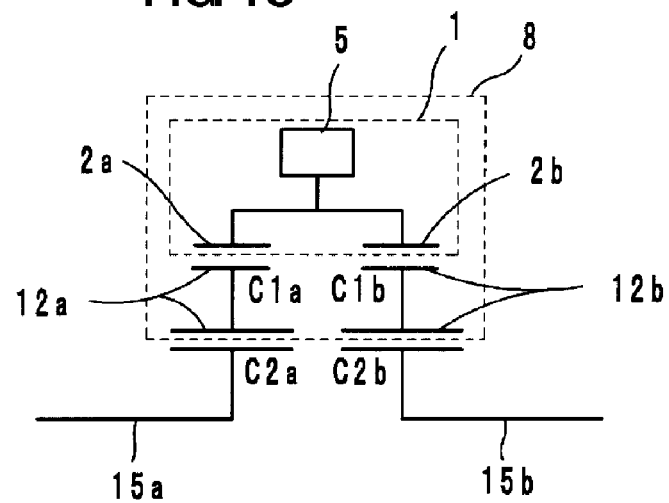
Figure 2A:
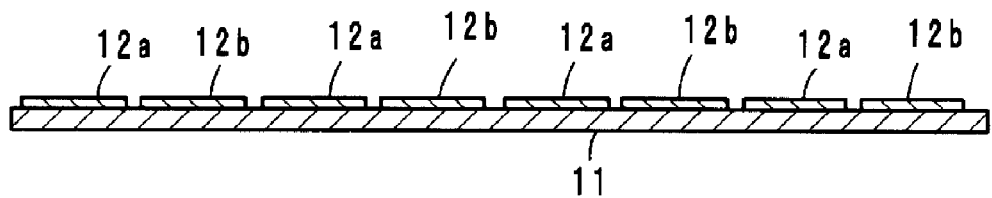
FIGS. 2A-2D are diagrams describing a process of manufacturing a radio frequency IC device according to the first preferred embodiment of the present invention.
Figure 2B:
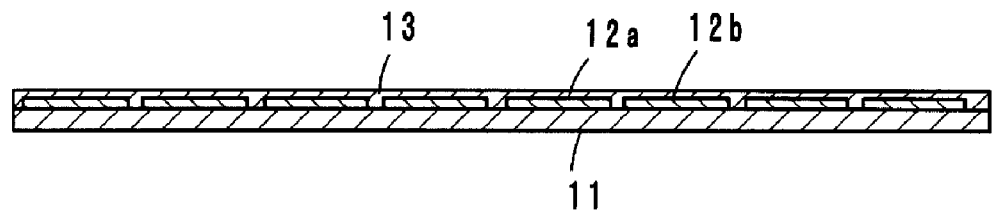
Figure 2C:
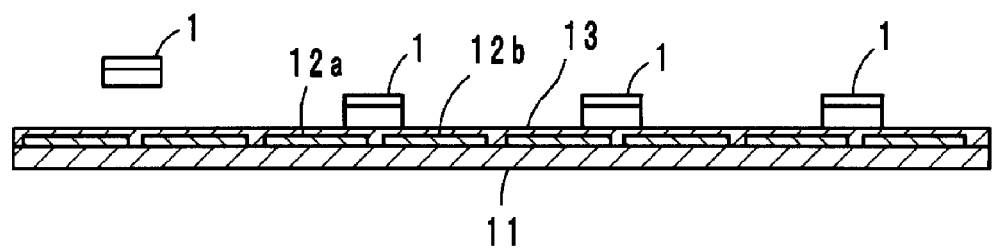
Figure 2D:
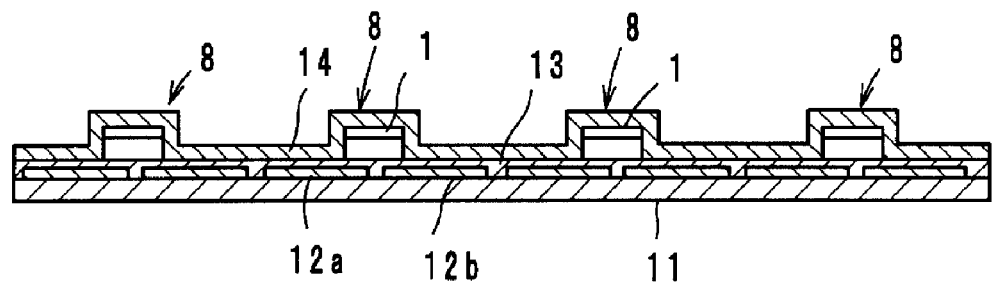

FIG. 1C illustrates an equivalent circuit of a radio frequency IC device according to the first preferred embodiment. The radio frequency IC element 1 and the radiation electrode 15a are coupled via a capacitor having the capacitance value C1a and a capacitor having the capacitance value C2a which are connected in series between the radio frequency IC element 1 and the radiation electrode 15a. The radio frequency IC element 1 and the radiation electrode 15b are coupled via a capacitor having the capacitance value C1b and a capacitor having the capacitance value C2b which are connected in series between the radio frequency IC element 1 and the radiation electrode 15b. Here, C1a, C1b<C2a, C2b is set. For example, a capacitance obtained by combining the capacitance values C1a and C1b is about 2 pF, and a capacitance obtained by combining the capacitance values C2a and C2b is about 20 pF.

In this case, a capacitance value C between the radio frequency IC chip 5 and each of the radiation electrodes 15a and 15b is controlled by the very small capacitance values C1a and C1b. When C1a and C1b are set as C1 and C2a and C2b are set as C2, the following equation is obtained.

$$C = C1 \times C2/(C1 + C2)$$
$$= C1/\{(C1/C2) + 1\}$$

When the capacitance value C1 is much smaller than the capacitance value C2 (C2>>C1), the value of (C1/C2) is close to zero. Accordingly, the capacitance value C is controlled by the capacitance value C1. The capacitance value C2 can be easily increased by increasing areas of an overlapping portion of the intermediate electrode 12a and the radiation electrode 15a and an overlapping portion of the intermediate electrode 12b and the radiation electrode 15b. The capacitance value C1a is obtained between the input/output electrode 2a of the radio frequency IC element 1 and the intermediate electrode 12a on the first base 11, and the capacitance value C1b is obtained between the input/output electrode 2b of the radio frequency IC element 1 and the intermediate electrode 12b on the first base 11. The radio frequency IC element 1 can be accurately mounted on the first base 11 using an IC installation apparatus in the related art, and variations in the capacitance value C1 (C1a and C1b) rarely occur. On the other hand, the capacitance value C2a is obtained between the intermediate electrode 12a and the radiation electrode 15a, and the capacitance value C2b is obtained between the intermediate electrode 12b and the radiation electrode 15b. Even if the first base 11 is inaccurately mounted on the second base 16 and variations in the capacitance value C2 (C2a and C2b) occur, the capacitance value C2 (C2a and C2b) has little effect on the capacitance value C between the radio frequency IC element 1 and each of the radiation electrodes 15a and 15b. Accordingly, the occurrence of variations in the capacitance value C between the radio frequency IC element 1 and each of the radiation electrodes 15a and 15b is suppressed and minimized, and the reduction in signal transmission efficiency caused by impedance mismatching can be prevented. It is desired that C2 be about 5 to about 10 times C1, for example.

The size of the second base 16 is preferably larger than that of the first base 11 in the first preferred embodiment. The first base 11 includes the small-sized radio frequency IC chip 5, and is small in size. By using the large-sized second base 16, the small-sized first base 11 can be easily attached to the second base 16. In this case, installation is more accurately performed as compared with a case in which the radio frequency IC element 1 is mounted on the large-sized second base 16.

The first base 11 and the intermediate electrodes 12a and 12b have flexibility. Therefore, the basic module 8 can be easily handled, and the first base 11 can be easily attached to the second base 16. It is desired that the second base 16 and the radiation electrodes 15a and 15b have flexibility so as to attach the radio frequency IC device to variously-shaped surfaces of products.

Next, a method of manufacturing a radio frequency IC device will be described with reference to FIGS. 2A-2D and 3A-3C. First, the intermediate electrodes 12a and 12b are formed on the first base 11 functioning as a substrate using the ink jet method or the screen printing method (see FIG. 2A). Subsequently, a double-side tape is attached to the first base 11 as the insulating adhesive layer 13 so that the double-side tape covers the intermediate electrodes 12a and 12b on the first base 11 (see FIG. 2B). Subsequently, the radio frequency IC elements 1 are disposed at predetermined positions on the insulating adhesive layer 13 (see FIG. 2C). At that time, the radio frequency IC element 1 is accurately disposed so that the input/output electrodes 2a and 2b face the intermediate electrodes 12a and 12b, respectively, at predetermined positions.

Figure 3A:
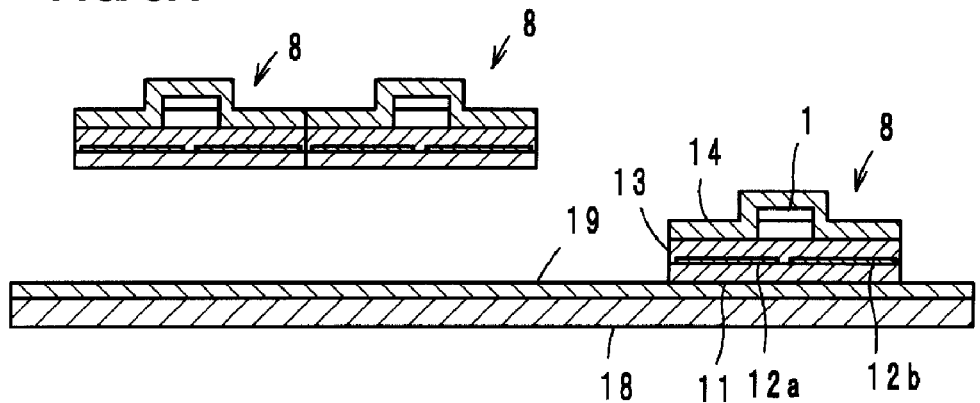
FIGS. 3A-3C are diagrams describing the process of manufacturing a radio frequency IC device according to the first preferred embodiment (subsequent to FIG. 2D) of the present invention.
Figure 3B:
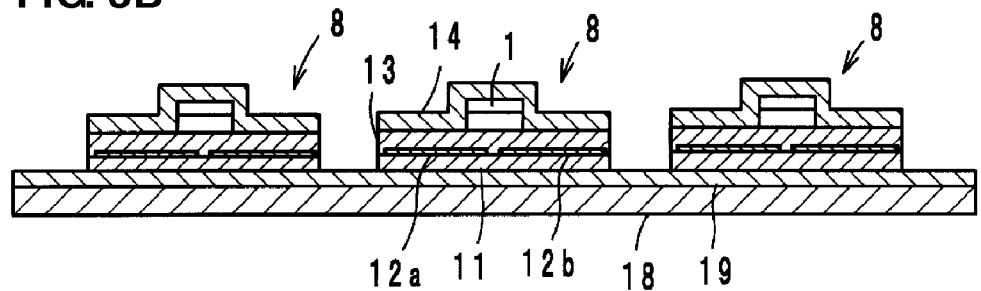

Subsequently, a double-side tape is attached to the first base 11 as the insulating adhesive layer 14 so that the double-side tape covers the radio frequency IC elements 1. As a result, the group of the basic modules 8 is obtained (see FIG. 2D). Subsequently, as illustrated in FIG. 3A, the group is cut into the separate basic modules 8 and the basic modules 8 are attached to a base film 18 via an adhesive layer 19 (see FIG. 3B). Subsequently, the base film 18 is turned upside down, the basic modules 8 are separated from the base film 18 one by one, and the basic module 8 is attached to the second base 16 on which the radiation electrodes 15a and 15b are formed via the insulating adhesive layer 14 (see FIG. 3C). At that time, the attachment of the basic module 8 is performed so that the intermediate electrodes 12a and 12b face the radiation electrodes 15a and 15b, respectively, at predetermined positions, and high attachment position accuracy is not required as described previously.

Modification of Basic Module 8

Figure 5A:
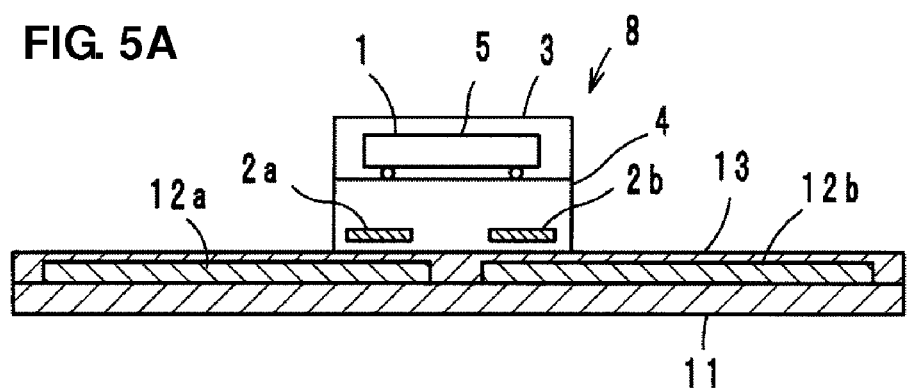
FIG. 5A is a cross-sectional view of a first modification of the basic module.

Various types of the basic modules 8 can be used. A first modification of the basic module 8 is illustrated in FIG. 5A. The basic module 8 is preferably the same as the basic module 8 illustrated in FIG. 4 except that the input/output electrodes 2a and 2b are disposed in the feeding circuit board 4. In the basic module 8, the input/output electrodes 2a and 2b are capacitively coupled to the intermediate electrodes 12a and 12b, respectively, via the insulating adhesive layer 13 and a dielectric layer of the feeding circuit board 4.

Figure 5B:
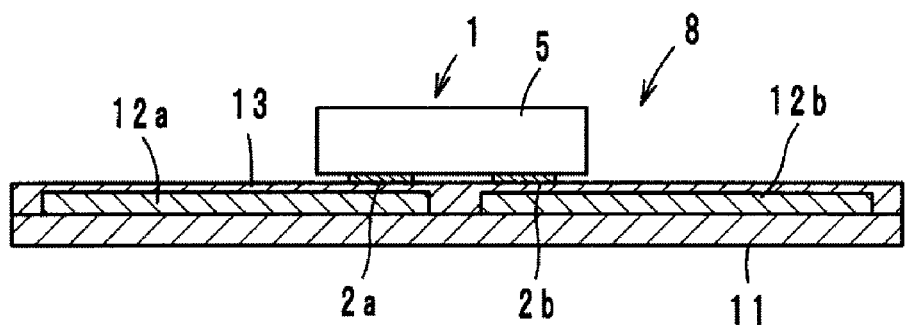
FIG. 5B is a cross-sectional view of a second modification of the basic module.

In a second modification of the basic module 8, as illustrated in FIG. 5B, a feeding circuit board is not disposed and the input/output electrodes 2a and 2b disposed on the undersurface of the radio frequency IC chip 5 surface and are capacitively coupled to the intermediate electrodes 12a and 12b, respectively, via the insulating adhesive layer 13.

Modification of Manufacturing Process

Figure 3C:
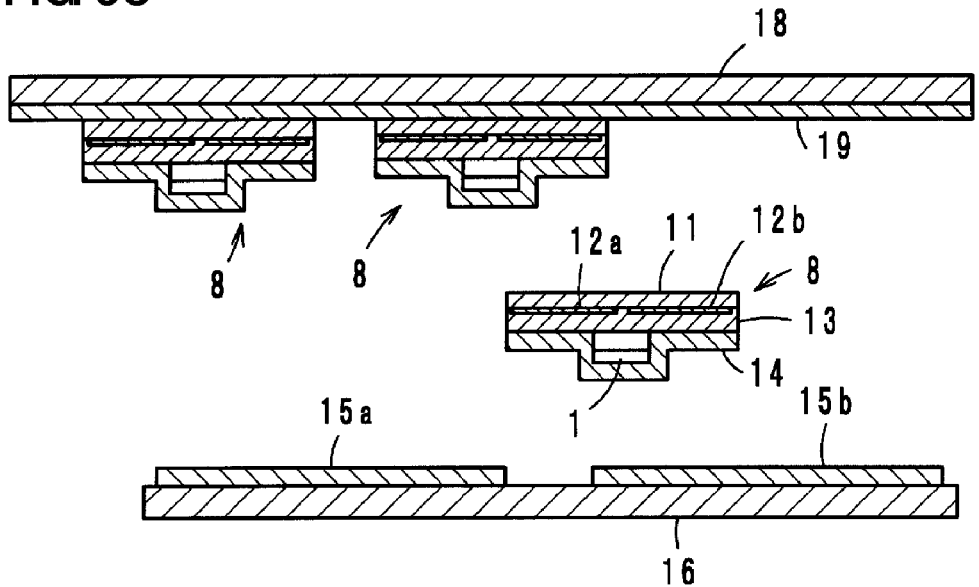
Figure 6A:
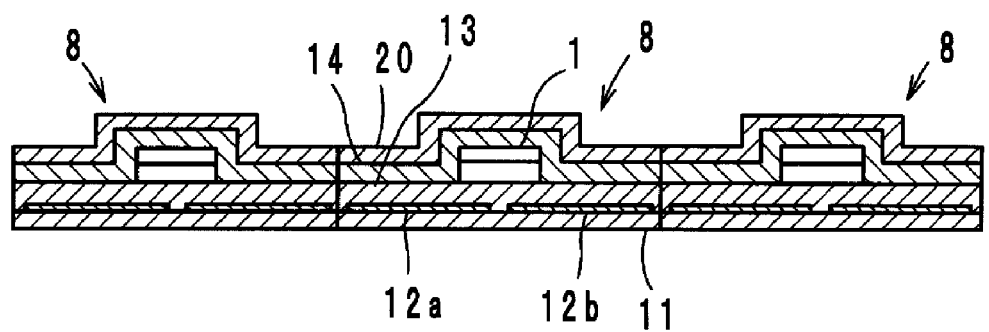
FIGS. 6A and 6B are diagrams describing a modification of a manufacturing process.
Figure 6B:
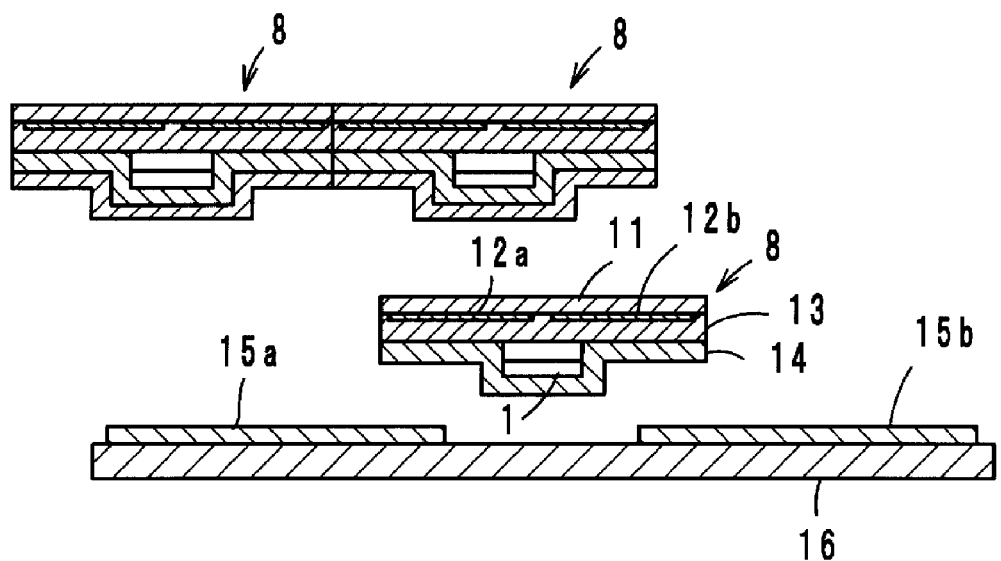

The manufacturing method illustrated in FIGS. 2 and 3 can be variously changed. A modification of the manufacturing method is illustrated in FIGS. 6A and 6B. After the process illustrated in FIG. 2D has been performed, a cover sheet 20 is attached to the surface of the insulating adhesive layer 14 (see FIG. 6A). Subsequently, the cover sheet 20 is removed and the basic module 8 is attached to the second base 16 (see FIG. 6B). The process illustrated in FIG. 6B corresponds to the process illustrated in FIG. 3C. Thus, by attaching the cover sheet 20 in the middle of the manufacturing process, it is possible to avoid adherence of dust or the like to the surface of the insulating adhesive layer 14. Any material can be used for the cover sheet 20.

Second Preferred Embodiment

Figure 7A:
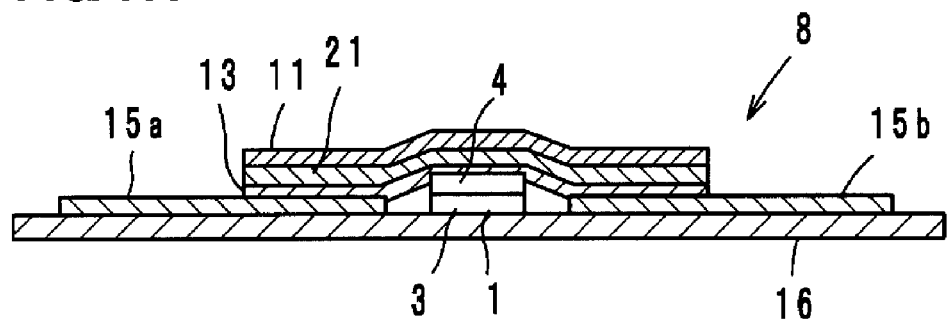
Figure 7B:
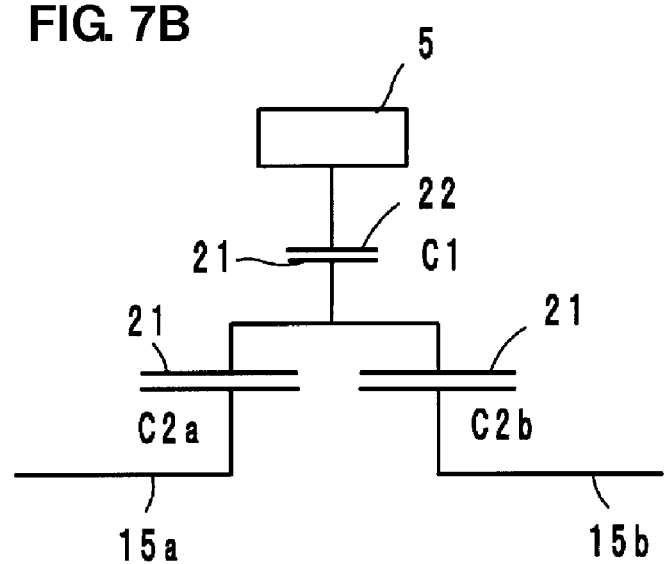
Figure 7C:
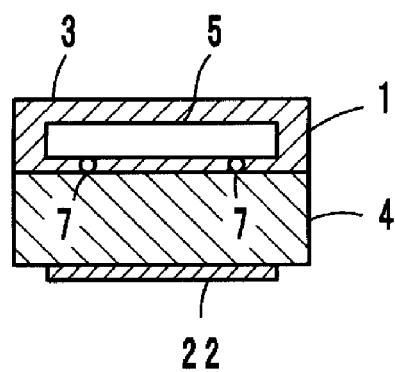

As illustrated in FIG. 7C, in a radio frequency IC device according to the second preferred embodiment, a single input/output electrode 22 is disposed on the surface of the feeding circuit board 4. The input/output electrode 22 faces and is capacitively coupled to an intermediate electrode 21. Except this point, the second preferred embodiment is preferably the same as the first preferred embodiment. FIG. 7B illustrates an equivalent circuit of a radio frequency IC device according to the second preferred embodiment. The input/output electrode 22 and the intermediate electrode 21 are capacitively coupled with the capacitance value C1. The capacitance value C1 is, for example, about 4 pF, and a capacitance value obtained by combining the capacitance value C2a between the intermediate electrode 21 and the radiation electrode 15a and the capacitance value C2b between the intermediate electrode 21 and the radiation electrode 15b is, for example, about 20 pF.

In the second preferred embodiment, the insulating adhesive layer 14 is not formed, and the radio frequency IC element 1 is in contact with the second base 16.

Third Preferred Embodiment

Figure 8A:
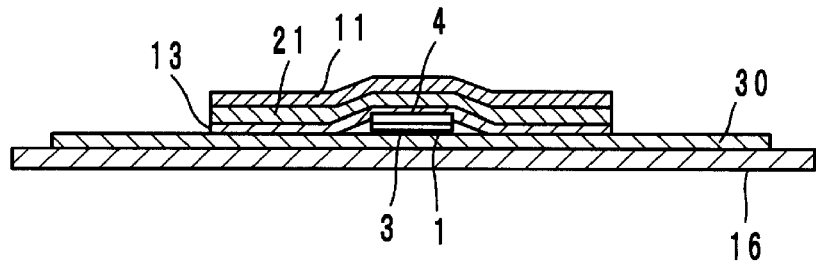
Figure 8B:
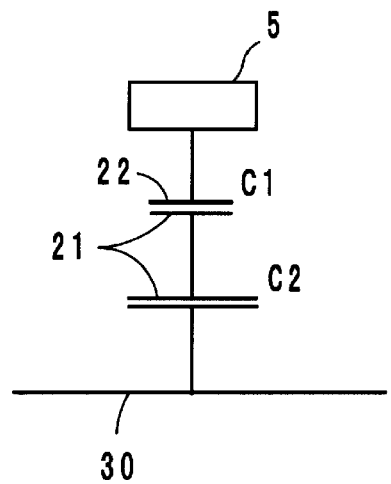

As illustrated in FIG. 8A, in a radio frequency IC device according to the third preferred embodiment, a single radiation electrode 30 is disposed on the second base 16. Like in the second preferred embodiment, the input/output electrode 22 is capacitively coupled to the intermediate electrode 21. FIG. 8B illustrates an equivalent circuit of a radio frequency IC device according to the third preferred embodiment. The input/output electrode 22 and the intermediate electrode 21 are capacitively coupled with the capacitance value C1, and the intermediate electrode 21 and the radiation electrode 30 are capacitively coupled with the capacitance value C2. The capacitance value C1 is, for example, about 3 pF, and the capacitance value C2 is, for example, about 20 pF.

In the third preferred embodiment, the radiation electrode 30 may have a large area (for use in the UHF frequency band), or have a loop shape (for use in the HF frequency band).

Fourth Preferred Embodiment

Figure 9:
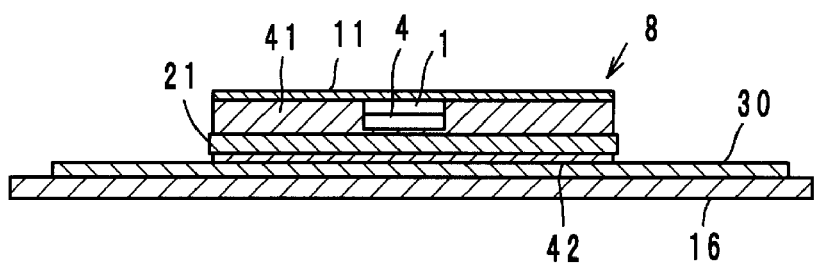
FIG. 9 is a cross-sectional view of a radio frequency IC device according to a fourth preferred embodiment of the present invention.

As illustrated in FIG. 9, in a radio frequency IC device according to the fourth preferred embodiment, the radio frequency IC element 1 mounted on the first base 11 is covered with an insulating adhesive layer 41 (formed of, for example, an epoxy resin) and the intermediate electrode 21 is attached to the insulating adhesive layer 41. As a result, the basic module 8 is formed. The basic module 8 is attached to the second base 16 including the radiation electrode 30 via an insulating adhesive layer 42 (formed of, for example, an epoxy resin). As a result, a radio frequency IC device is formed. An equivalent circuit of a radio frequency IC device according to the fourth preferred embodiment is the same as that illustrated in FIG. 8B.

Fifth Preferred Embodiment

Figure 10:
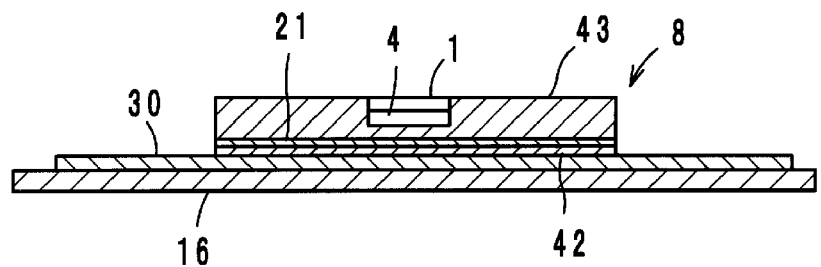
FIG. 10 is a cross-sectional view of a radio frequency IC device according to a fifth preferred embodiment of the present invention.

As illustrated in FIG. 10, in a radio frequency IC device according to the fifth preferred embodiment, the radio frequency IC element 1 is embedded in a soft insulating adhesive layer 43 (for example, an epoxy resin layer of B stage), and the intermediate electrode 21 is attached to the insulating adhesive layer 43. As a result, the basic module 8 is formed. The basic module 8 is attached to the second base 16 including the radiation electrode 30 via the insulating adhesive layer 42. As a result a radio frequency IC device is formed. An equivalent circuit of a radio frequency IC device according to the fifth preferred embodiment is the same as that illustrated in FIG. 8B. In the fifth preferred embodiment, the insulating adhesive layer 43 functions as a first base.

Sixth Preferred Embodiment

Figure 11:
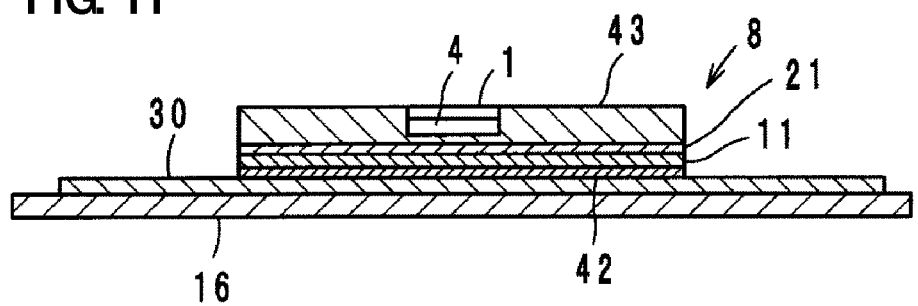
FIG. 11 is a cross-sectional view of a radio frequency IC device according to a sixth preferred embodiment of the present invention.

As illustrated in FIG. 11, in a radio frequency IC device according to the sixth preferred embodiment, the radio frequency IC element 1 is embedded in the soft insulating adhesive layer 43, and the insulating adhesive layer 43 is attached to the intermediate electrode 21 located on the first base 11. As a result, the basic module 8 is formed. The basic module 8 is attached to the second base 16 including the radiation electrode 30 via the insulating adhesive layer 42. As a result, a radio frequency IC device is formed. An equivalent circuit of a radio frequency IC device according to the sixth preferred embodiment is the same as that illustrated in FIG. 8B.

Seventh Preferred Embodiment

Figure 12A:
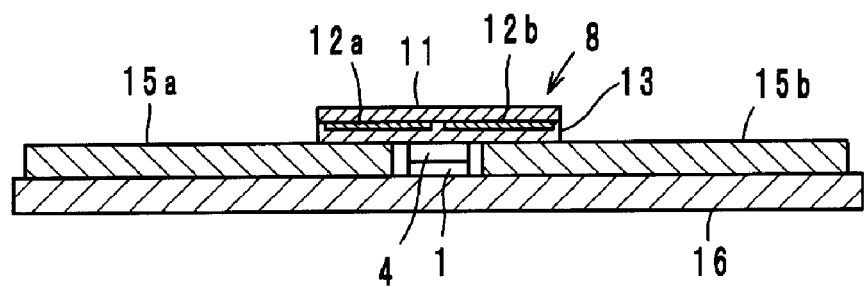
Figure 12B:
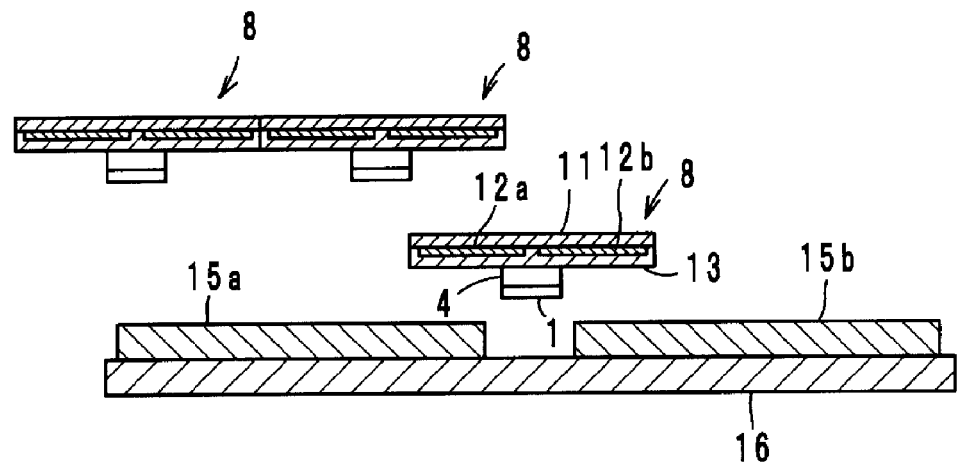

As illustrated in FIG. 12A, the configuration of a radio frequency IC device according to the seventh preferred embodiment is basically the same as that of a radio frequency IC device according to the first preferred embodiment except that the insulating adhesive layer 14 is not formed. Accordingly, immediately after the process illustrated in FIG. 2C, the basic modules 8 are separated one by one, and each of the basic modules 8 is attached to the second base 16 including the radiation electrodes 15a and 15b (see FIG. 12B).

Eighth Preferred Embodiment

Figure 13A:
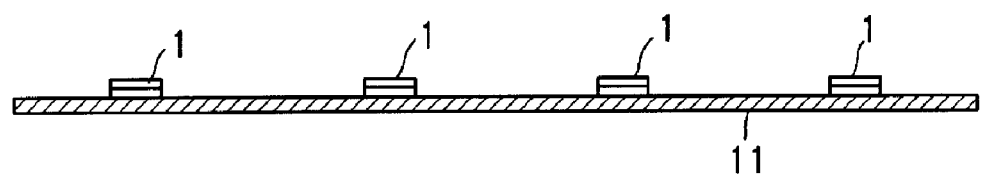
FIGS. 13A-13D are diagrams describing a process of manufacturing a radio frequency IC device according to an eighth preferred embodiment of the present invention.
Figure 13B:
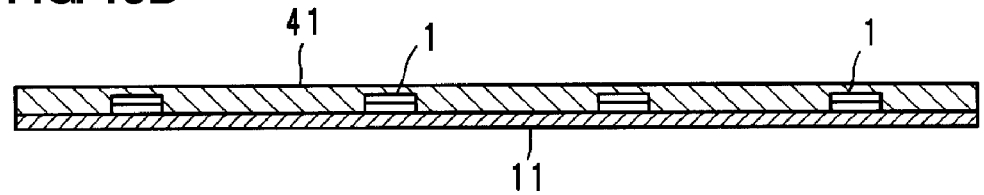
Figure 13C:
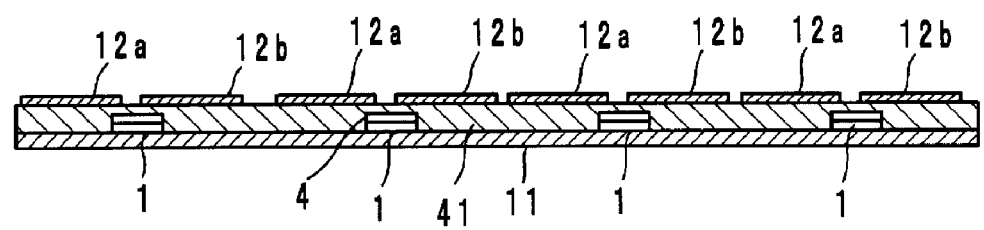
Figure 13D:
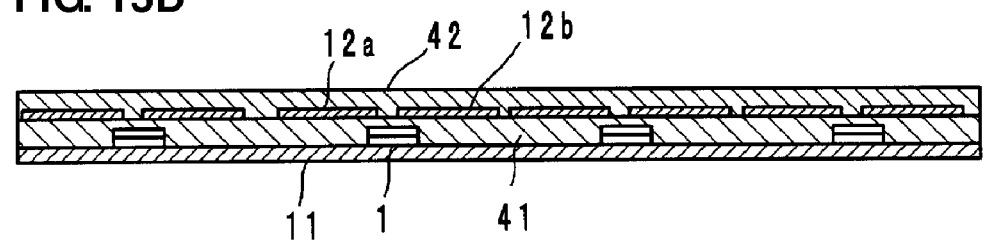
Figure 14A:
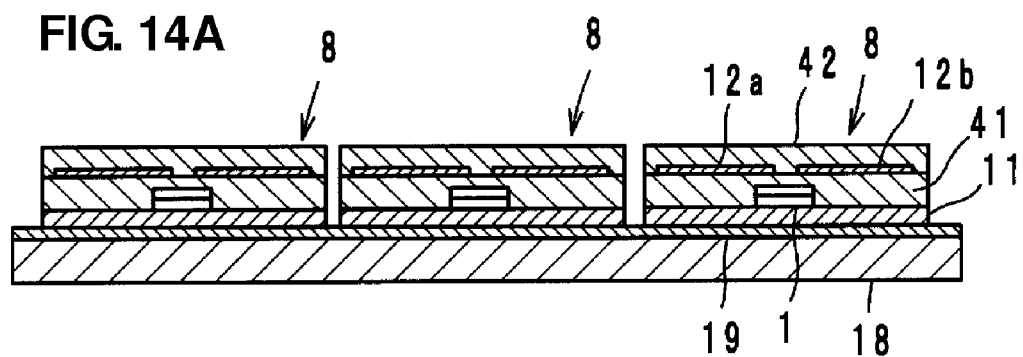
FIGS. 14A and 14B are diagrams describing the process of manufacturing a radio frequency IC device according to the eighth preferred embodiment (subsequent to FIG. 13D) of the present invention.
Figure 14B:
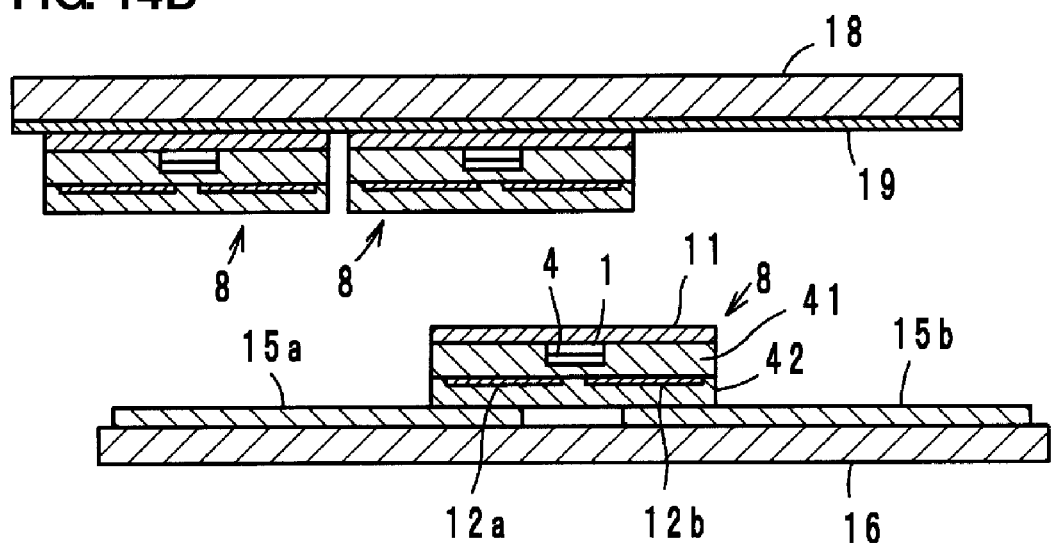

A process of manufacturing a radio frequency IC device according to the eighth preferred embodiment will be described. First, a plurality of radio frequency IC elements 1 are mounted on the first base 11 at predetermined intervals (see FIG. 13A), and are covered with the insulating adhesive layer 41 (see FIG. 13B). Subsequently, the intermediate electrodes 12a and the intermediate electrodes 12b are disposed on the insulating adhesive layer 41 (see FIG. 13C). The intermediate electrodes 12a and 12b may be obtained by forming an electrode film on the entire surface of the insulating adhesive layer 41 and patterning the insulating adhesive layer 41 into a predetermined shape. Subsequently, the insulating adhesive layer 42 is formed on the insulating adhesive layer 41 so that the insulating adhesive layer 41 covers the intermediate electrodes 12a and 12b (see FIG. 13D). Subsequently, the basic modules 8 are cut one by one, and are each attached to the base film 18 via the adhesive layer 19 (see FIG. 14A). Subsequently, the base film 18 is turned upside down, the basic modules 8 are separated from the base film 18 one by one, and the basic module 8 is attached to the second base 16 on which the radiation electrodes 15a and 15b are formed (see FIG. 14B).

An equivalent circuit of a radio frequency IC device according to the eighth preferred embodiment is the same as that illustrated in FIG. 1C, and an operational effect of the eighth preferred embodiment is also the same as that of the first preferred embodiment.

Ninth Preferred Embodiment

Figure 15A:
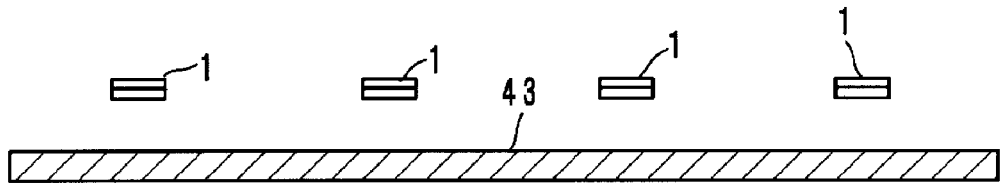
FIGS. 15A-15E are diagrams describing a process of manufacturing a radio frequency IC device according to a ninth preferred embodiment of the present invention.
Figure 15B:
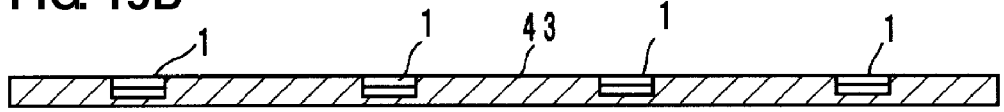
Figure 15C:
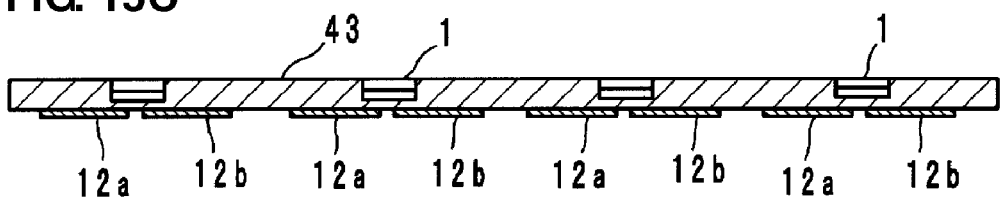
Figure 15D:
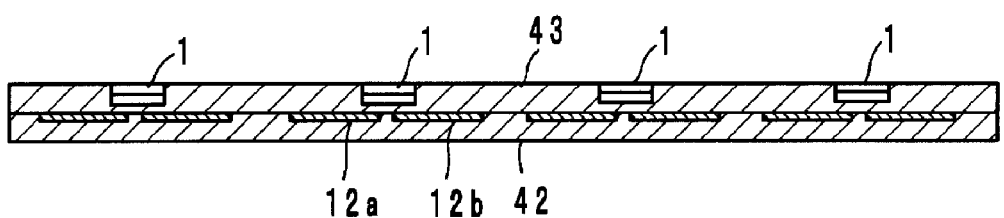
Figure 15E:
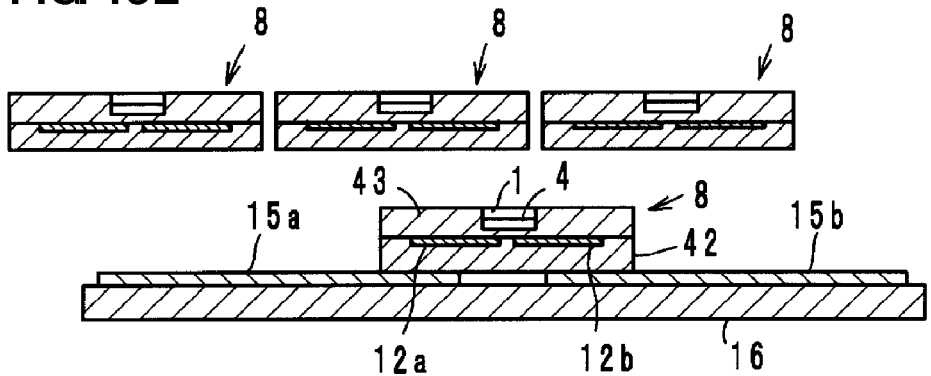

A process of manufacturing a radio frequency IC device according to the ninth preferred embodiment will be described. First, a plurality of radio frequency IC elements 1 are embedded in the soft insulating adhesive layer 43 at predetermined intervals (see FIGS. 15A and 15B). The intermediate electrodes 12a and the intermediate electrodes 12b are formed on the insulating adhesive layer 43 (see FIG. 15C). Subsequently, the insulating adhesive layer 42 is formed on the insulating adhesive layer 43 so that the insulating adhesive layer 42 covers the intermediate electrodes 12a and 12b (see FIG. 15D). Subsequently, the basic modules 8 are cut one by one, and are each attached to the second base 16 on which the radiation electrodes 15a and 15b are formed (see FIG. 15E).

An equivalent circuit of a radio frequency IC device according to the ninth preferred embodiment is the same as that illustrated in FIG. 1C, and an operational effect of the ninth preferred embodiment is also the same as that of the first preferred embodiment.

Other Preferred Embodiments

A radio frequency IC device according to the present invention and a method of manufacturing the radio frequency IC device are not limited to the above-described preferred embodiments, and various changes can be made thereto without departing from the scope and spirit of the present invention.

As described previously, preferred embodiments of the present invention are useful for a radio frequency IC device and a method of manufacturing the radio frequency IC device, and provide significant advantages to prevent variations in the value of capacitive coupling between a radio frequency IC element and a radiation electrode and having good signal transmission efficiency.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency IC device comprising:
a radio frequency IC element including an input/output electrode;
a first base including an intermediate electrode; and
a second base including a radiation electrode; wherein
the intermediate electrode is capacitively coupled to the input/output electrode via a first capacitance having a capacitance value C1;
the radiation electrode is capacitively coupled to the intermediate electrode via a second capacitance having a capacitance value C2;
the first capacitance and the second capacitance are connected in series with one another between the radio frequency IC element and the radiation electrode; and
the capacitance value C2 is greater than the capacitance value C1.

2. The radio frequency IC device according to claim 1, wherein the radio frequency IC element is attached to the first base via an insulating adhesive layer so that the input/output electrode and the intermediate electrode face each other.

3. The radio frequency IC device according to claim 1, wherein the first base is attached to the second base via an insulating adhesive layer so that the intermediate electrode and the radiation electrode face each other.

4. The radio frequency IC device according to any one of claim 1, wherein the first base is mounted on the second base, and the radio frequency IC element is sandwiched between the first base and the second base.

5. The radio frequency IC device according to claim 4, wherein the radio frequency IC element is in contact with the second base via an insulating adhesive layer.

6. The radio frequency IC device according to claim 1, wherein the second base is larger than the first base.

7. The radio frequency IC device according to claim 1, wherein the first base and the intermediate electrode have flexibility.

8. The radio frequency IC device according to claim 1, wherein the radio frequency IC element includes a radio frequency IC chip and a feeding circuit board, and the input/output electrode is disposed on or in the feeding circuit board.

9. A radio frequency IC device manufacturing method comprising:
a step of mounting a radio frequency IC element including an input/output electrode on a first base including an intermediate electrode and capacitively coupling the input/output electrode and the intermediate electrode via a first capacitance having a capacitance value C1;
a step of mounting the first base, on which the radio frequency IC element is mounted, on a second base including a radiation electrode and capacitively coupling the intermediate electrode and the radiation electrode via a second capacitance having;
a step of connecting the first capacitance and the second capacitance in series with one another between the radio frequency IC element and the radiation electrode; and
a step of setting the capacitance value C2 to be greater than the capacitance value C1.

* * * * *